(12) United States Patent
Carrington et al.

(10) Patent No.: US 6,538,430 B2
(45) Date of Patent: Mar. 25, 2003

(54) SCREENING TEST FOR TRANSVERSE MAGNETIC-FIELD EXCITED NOISE IN GIANT MAGNETORESISTIVE HEADS

(75) Inventors: Chris Carrington, Gonzales, CA (US); Peter Cheng-I Fang, San Jose, CA (US); Don Horne, Raymond, WA (US); Christopher Dana Keener, San Jose, CA (US); Kenneth Donald Mackay, San Jose, CA (US); Antonio Perez, Jr., San Jose, CA (US); Frederick William Stukey, Jr., San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/938,436

(22) Filed: Aug. 23, 2001

(65) Prior Publication Data

US 2003/0038626 A1 Feb. 27, 2003

(51) Int. Cl.⁷ .................... G01R 33/12; G11B 5/455; G11B 5/39
(52) U.S. Cl. .................... 324/210; 29/603.09
(58) Field of Search ................ 324/210, 212, 324/235, 262; 29/603.07, 603.09

(56) References Cited

U.S. PATENT DOCUMENTS

| | | | |
|---|---|---|---|
| 3,710,235 A | 1/1973 | Barrager et al. | 324/34 R |
| 5,696,445 A | 12/1997 | Inbar | 324/228 |
| 5,721,488 A | 2/1998 | Sakai et al. | 324/210 |
| 5,854,554 A | 12/1998 | Tomita et al. | 324/210 |
| 5,926,019 A | 7/1999 | Okumura | 324/210 |
| 5,998,993 A | 12/1999 | Inage et al. | 324/210 |

FOREIGN PATENT DOCUMENTS

| | | | |
|---|---|---|---|
| JP | 61-80076 | 4/1986 | G01R/35/00 |
| JP | 63-158478 | 7/1988 | G01R/33/12 |
| JP | 4334077 | 11/1992 | H01L/43/08 |
| JP | 6150264 | 5/1994 | G11B/5/455 |
| JP | 6187620 | 7/1994 | G11B/5/455 |
| JP | 7230611 | 8/1995 | G11B/5/455 |
| JP | 8030928 | 2/1996 | G11B/5/39 |
| JP | 10188230 | 7/1998 | G11B/5/39 |
| JP | 10320727 | 12/1998 | G11B/5/455 |

OTHER PUBLICATIONS

*IBM Technical Disclosure Bulletin,* vol. 34, No. 6, Nov. 1991, "Barkhausen Noise Quantification Using a Derivative Approximation".

*IBM Technical Disclosure Bulletin,* vol. 21, No. 3, Aug. 1978, "Barkhausen Noise Measuring Device for Magnetoresistive Heads".

*Physical Review B,* vol. 51, No. 17, May 1, 1995, "Individual–domain–wall motion in $Ni_{0.77}Mn_{0.23}$ observed via resistance fluctuations".

*Primary Examiner*—Walter E. Snow
(74) *Attorney, Agent, or Firm*—Ervin F. Johnston

(57) ABSTRACT

A method and system for the rapid automatic screening of GMR heads for Barkhausen noise during production. This system rapidly and repeatedly measures associated noise in a GMR head subjected to a smoothly-varying external transverse magnetic field. The repeated Transverse Magnetic-field Excited Noise (TMEN) measurements are automatically sorted into bins to form a histogram, which is then automatically evaluated to develop TMEN range and weighted sum measures, which are then compared with predetermined standards for automatic acceptance or rejection of the GMR head under test. The GMR sensor Barkhausen noise is quantified through the use of a bandpass filter to remove all direct sensor responses, leaving only the noise signals, which are then repeatedly sampled to develop valid statistical Barkhausen noise measures suitable for automated analysis.

18 Claims, 5 Drawing Sheets

SCREENING TEST FOR TRANSVERSE MAGNETIC-FIELD EXCITED NOISE IN GIANT MAGNETORESISTIVE HEADS

BACKGROUND OF THE INVENTION

1. Field of the Invention

This invention relates generally to production self-noise testing methods for magnetoresistive heads and more particularly to a system for rapidly screening giant magnetoresistive heads for Barkhausen noise during production quality-control testing.

2. Description of the Related Art

In recent times, a class of metallic multilayer films exhibiting the giant magnetoresistive (GMR) effect has gained considerable attention for use as read heads for both hard-disk and magnetic-tape drives. GMR-effect read sensors exhibit a MR ratio, $\delta R/R$, which is typically 8% or higher, as compared with 2% for advanced magnetoresistive (AMR) read heads. The increased sensitivity of GMR devices allows a decrease in the read element track width so that track density and, ultimately, storage density can be increased. Today, the exchange-biased spin-valve (SV) is the GMR device attracting the most interest for use as a read sensor. The SV device itself consists of four layers. A free layer and a pinned layer, both comprising a soft ferromagnet, reside on either side of a nonmagnetic copper (Cu) spacer. An exchange layer of antiferromagnetic material (AFM) is deposited next to the pinned layer. The free layer is sufficiently thin to allow conduction electrons to move back and forth frequently between the free and pinned layers via the conducting spacer layer. The magnetic orientation of the pinned layer is fixed and held in place by the AFM layer, while the free layer's magnetic orientation changes in response to the magnetic field from a bit stored on the surface of a hard disk. This bit-field effectively switches the SV device between two alternative configurations (either high or low resistance), which correspond to the binary datum being read from the disk.

Looking ahead, the tunnel-junction (TJ) device will likely represent the next-generation read head. SVs consist of two ferromagnetic (FM) layers separated by a conductive nonmagnetic spacer layer such as copper, whereas tunnel junctions consist of two FM layers separated by a nonmagnetic electrically insulating layer. Tunnel junctions (like spin valves) exhibit a two-state magnetoresistance dependent upon the relative orientation of the two ferromagnetic layers, which conveniently lends itself to magnetic data-storage applications. Existing tunnel-junction devices exhibit MR ratios of over 25% compared to 10% for SVs. This increased sensitivity allows further decreases in bit size for smaller track widths and larger track densities.

Significant challenges are encountered in the development and manufacture of GMR thin-film devices. Of primary concern is the uniformity and thickness of the deposited layers; the thickness of copper spacing layer is typically less angstroms. Film properties significantly affect the magnetoresistance, resistivity, magnetization, and magnetostriction of the GMR device. Furthermore, intrinsic film properties, such as surface roughness, affect the coupling between layers, the coercivity of the free layer, the effectiveness of the antiferromagnetic layer in pinning one of the magnetic layers, and domain (Barkhausen) noise characteristics.

Barkhausen noise in magnetoresistive heads has been a well-known problem since the late 1970s. Barkhausen noise occurs in any magnetic material when magnetic domains rotate or domain walls move in discrete steps as the ambient magnetic field is varied. The Barkhausen effect consists of discontinuous changes in flux density during smooth magnetic field changes. These are known as Barkhausen jumps (avalanches) and are caused by the sudden irreversible motion of magnetic domain walls as they break away from pinning sites. Barkhausen noise therefore depends on the interaction of domain walls with pinning sites. The dynamics of Barkhausen noise is typical of many complex systems, such as earthquakes, sand-piles, superconductors, and so forth. Magnetic and acoustic Barkhausen noise are both well-known in the art.

Ideally, the MR sensing layers are fabricated as a single domain having no walls to shift noisily during external magnetic field changes. However, the single magnetic domain is sometimes broken by stresses or distortions arising from the head finishing processes. In U.S. Pat. No. 5,926,019, Okumura discloses a method for evaluating, in a frequency range corresponding to actual data recording/playback operation, the Barkhausen noise of a magnetoresistive head after completion of the head-gimbal assembly process. Okumura uses a bandpass filter to remove carrier and harmonics, thereby extracting a single aggregate measure of the Barkhausen noise in a frequency region close to the hard disk data read-back rate. Okumura uses a video display to detect Barkhausen noise and neither considers nor suggests any method for automatic evaluation of the statistical characteristics of Barkhausen noise.

In U.S. Pat. No. 5,721,488, Sakai et al. discloses a method and apparatus for testing an integrated magnetic head assembly for normal operation. Sakai uses the same write head to excite the read sensor for Barkhausen noise measurements but neither considers nor suggests any method for evaluating the statistical characteristics of Barkhausen noise.

In Japanese Patent No. JP10188230, Morita Hiroshi discloses a method for measuring Barkhausen noise in a magnetic head that is fundamentally typical of many earlier methods known in the art. Hiroshi exposes the magnetoresistive head assembly to an external alternating magnetic field such as may be produced by a Helmholtz coil. The magnetoresistive head output is detected, differentiated and filtered by a notch filter to remove the alternating field frequency from the differentiated Barkhausen noise signal. As with earlier methods, Hiroshi neither considers nor suggests any method for automatic evaluation of the statistical characteristics of Barkhausen noise.

Consistent quantification of Barkhausen noise in magnetoresistive heads is a well-known problem in the art. Practitioners such as Hiroshi rely on signal differentiation for quantifying Barkhausen noise. In U.S. Pat. No. 5,854,554, Tomita et al. disclose a method and apparatus for testing magnetic heads that provides for repeated measurement cycles to improve Barkhausen noise detection. Significantly, Tomita et al. teach the use of a visual display monitor as the primary means for detecting the presence or absence of Barkhausen noise. When applied to production quality control, Tomita et al. teach judging whether the tested magnetic head is a good article or not depending upon whether Barkhausen noise is produced or not. This sort of subjective quality control evaluation technique is the only method known in the art for screening production magnetoresistive heads for Barkhausen noise.

There is accordingly a clearly felt need for a magnetoresistive head production quality control screening method that rapidly, reliably and automatically evaluates the statistical Barkhausen noise parameters to judge whether the magnetoresistive head should be accepted or rejected. The related unresolved problems and deficiencies are clearly felt in the art and are solved by this invention in the manner described below.

SUMMARY OF THE INVENTION

This invention solves the above problem by rapidly and repeatedly measuring associated noise in a GMR head subjected to a smoothly-varying external transverse magnetic field. The repeated Transverse Magnetic-field Excited Noise (TMEN) measurements are automatically sorted into bins to form a histogram, which is then automatically evaluated to develop TMEN range and weighted sum measures, which are then compared with predetermined standards for automatic acceptance or rejection of the GMR head under test.

It is a purpose of this invention to provide an apparatus and method for the rapid automatic screening of GMR heads for Barkhausen noise at the row level where other quasi-static measurements are performed during production. It is a feature of this invention that the GMR sensor Barkhausen noise is quantified through the use of a bandpass filter to remove all direct sensor responses, leaving only the noise signals, which are then repeatedly sampled to develop valid statistical Barkhausen noise measures suitable for automated analysis.

In one aspect, the invention is a method for measuring one or more intensity parameters of the magnetic noise of a GMR head having a signal bias current including the steps of applying to the GMR head a time-varying transverse magnetic field having a fundamental frequency, filtering the signal bias current to remove all frequency components below a lower band-pass frequency that is substantially higher than the fundamental transverse magnetic field frequency to produce a filtered signal bias current, sampling the filtered signal bias current at a sampling rate substantially higher than the lower band-pass frequency to produce a plurality of digital signals representing a plurality of filtered signal bias current values, sorting the plurality of digital signals by value to form a histogram having a TMEN range and weighted sum, and comparing at least one of the histogram TMEN range and the TMEN weighted sum to a respective predetermined threshold value to determine the intensity parameter of the GMR head magnetic noise.

In a preferred embodiment, the invention is a system for screening a plurality of giant magnetoresistive (GMR) heads for unacceptable magnetic noise levels, including a probe assembly for passing a signal bias current through a first GMR head, a coil assembly for applying to the first GMR head a time-varying transverse magnetic field having a fundamental frequency, a band-pass filter for removing from the signal bias current all frequency components below a lower band-pass frequency that is substantially higher than the fundamental transverse magnetic field frequency to produce a filtered signal bias current, an analog-to-digital converter assembly for sampling the filtered signal bias current at a sampling rate substantially higher than the lower band-pass frequency to produce a plurality of digital signals representing a plurality of filtered signal bias current values, an arithmetic logic assembly for sorting the plurality of digital signals by value to form a histogram having a TMEN range and weighted sum, a comparator for comparing at least one of the histogram TMEN range and weighted sum to a respective predetermined threshold value, and a test data logging assembly for recording the rejection of the first GMR head when at least one of the histogram TMEN range and weighted sum exceeds the respective predetermined threshold value.

The foregoing, together with other objects, features and advantages of this invention, can be better appreciated with reference to the following specification, claims and the accompanying drawing.

BRIEF DESCRIPTION OF THE DRAWINGS

For a more complete understanding of this invention, reference is now made to the following detailed description of the embodiments as illustrated in the accompanying drawing, in which like reference designations represent like features throughout the several views and wherein.

DESCRIPTION OF THE PREFERRED EMBODIMENT

Figure 1:
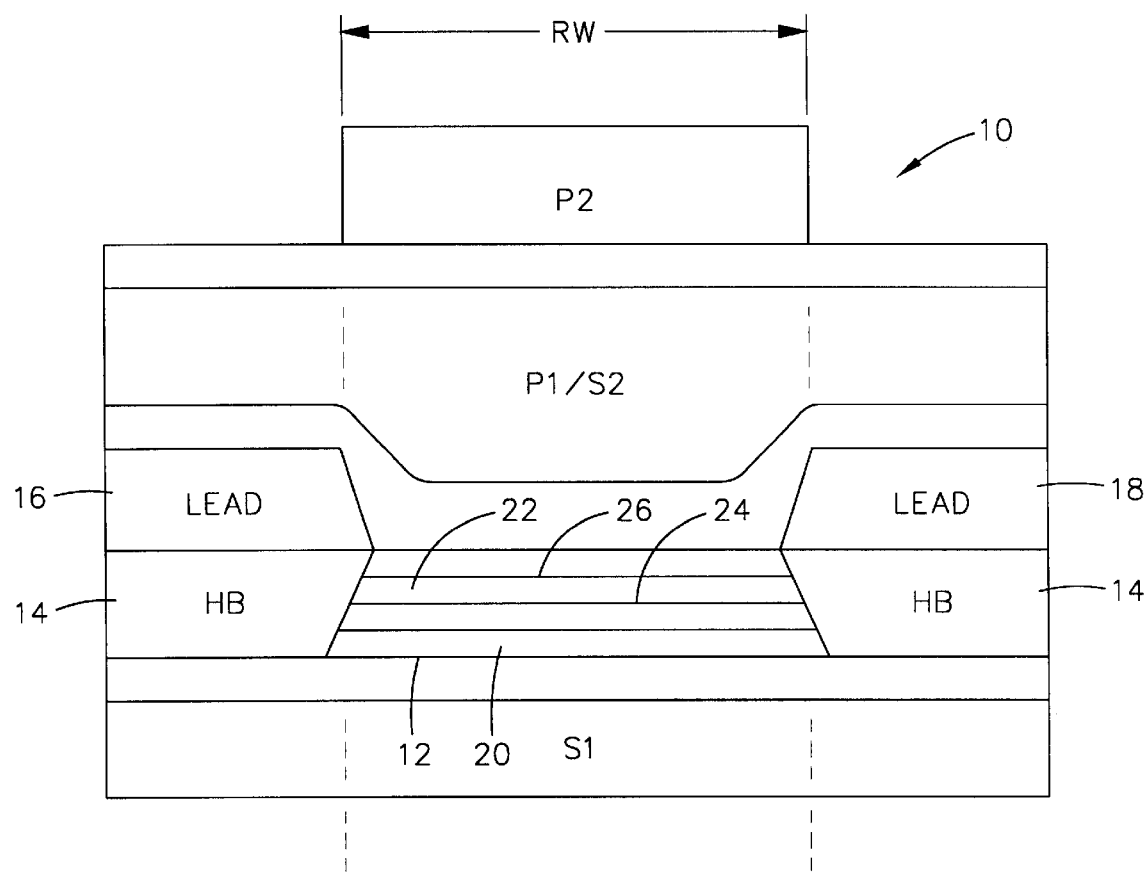
FIG. 1 illustrates the elements of a typical of GMR head known in the art.

In FIG. 1 illustrating a typical GMR read-write head 10, the read sensor portion includes a multi-layered spin-valve (SV) structure 12 disposed between the two hard-bias (HB) layers 14 and the two bias current leads 16 & 18. SV structure 12 includes a free ferromagnetic thin-film layer 20 and a pinned ferromagnetic thin-film layer 22 separated by a nonmagnetic conducting layer 24. Pinned layer 22 is exchange-biased by means of its contact with the antiferromagnetic (AF) thin-film exchange layer 26. Free layer 20 is hard biased by means of HB layers 14 and is free to reorient responsive to external magnetic fields such as the magnetic data bits stored on a hard disk surface in a track (not shown) having a width comparable to the RW dimension of GMR head 10 in a manner well-known in the art. In operation, a signal bias current is applied to SV structure 12 through leads 16–18 to sense the changes in resistance, which varies according to the differences in relative magnetic direction of free and pinned layers 20 and 22 because of the spin-valve effect well-known in the art. When free layer 20 consists essentially of a single domain, this variation is smooth and proportional to changes in external magnetic field producing little or no Barkhausen noise.

Figure 2:
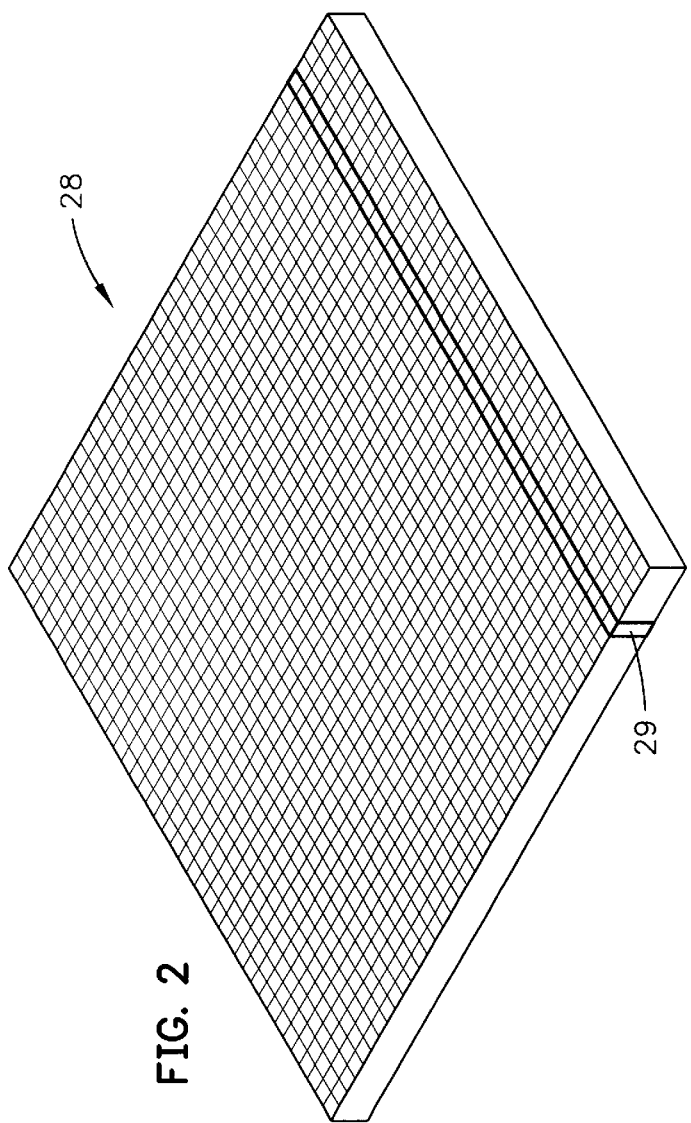
FIG. 2 illustrates a portion of a production wafer containing many GMR head assemblies as it appears during wafer level testing on a production line.

Heads such as GMR head 10 are manufactured using well-known thin-film techniques, which normally simultaneously produce many thousands of such heads on a single substrate wafer during a single production process. After the many different thinfilm layers are deposited and treated with heat, etchants, and so forth, the resulting production wafer, containing thousands of GMR read/write head elements similar to GMR head 10, is subjected to production quality control (QC) testing. FIG. 2 shows a schematic representation of a production wafer portion 28 containing numerous independent GMR head elements as it might appear during wafer-level QC testing on a production line. To control unit production costs, each of the many thousands of head elements in wafer portion 28 must be screened for acceptable performance before investing additional manufacturing cost in the head element. Eliminating unacceptable head elements at an early level avoids wasting the following fabrication expense. To facilitate such testing, automated probe positioning and measurement apparatus is used to perform the test(s) and to catalog and mark the rejected head elements on wafer portion 28. Following QC testing at the wafer level, the rows of elements are cut apart and lapped before row level QC testing. According to this invention, it is preferable to defer TMEN testing until the final element size is achieved, to give a more accurate measure of the expected noise level in the production element (or it could also be performed later in the process at the head-gimbal assembly (HGA) or the head-stack assembly (HSA) level). The magnetic instability does not manifest itself clearly until the rows are cut apart and lapped so that the elements have reached their final stripe height. The MR element on the wafer is several microns tall, and later is lapped down to about 0.5 μm height. This small remainder of the original element is the portion contributing to the magnetic instability noise.

Figure 3:
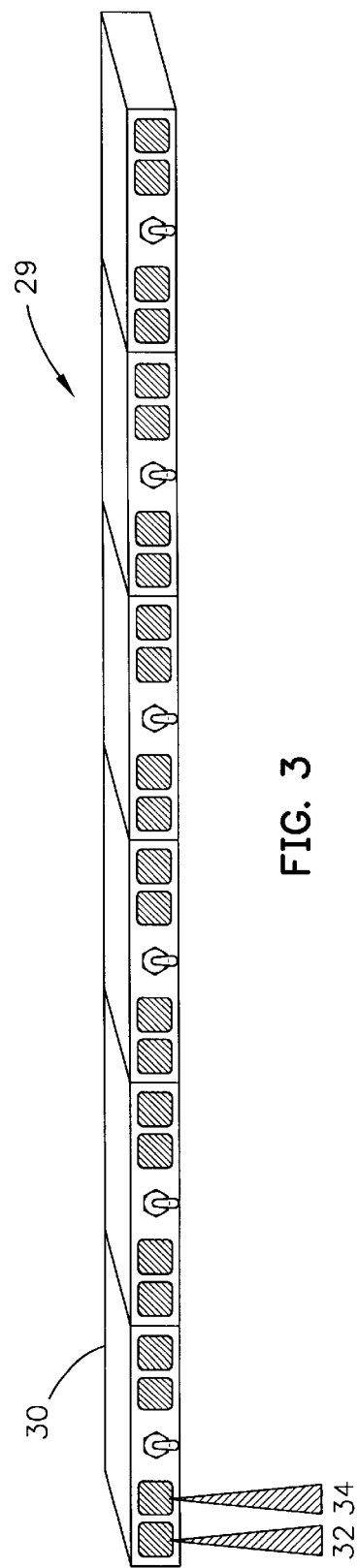
FIG. 3 illustrates a portion of a single row from the production wafer from FIG. 2 showing the GMR TMEN head test probe arrangement suitable for use with the method of this invention during row-level testing on a production line.

FIG. 3 shows a small portion the row 29 from a row-level detail from FIG. 2, which provides a schematic representation of the detail of the individual head elements exemplified by the head element 30. For the purposes of this description, only the read sensor terminals connected to bias current leads 16 & 18 (FIG. 1) are of interest and the two probe tips 32 & 34 are shown in contact with the two read sensor terminals of head element 30. In general terms, during testing, a bias current is applied to probes 32–34 and the resulting voltage is measured in any manner required for the particular testing objective. For instance, during a QC screening test for SV read-width (RW) geometry, a sequence of certain pulsed voltage measurements may be required together with associated automatic data processing. In contrast, during the Transverse Magnetic-field Excited Noise (TMEN) screening test of this invention, probe voltage is sampled numerous times over a predetermined interval while a time-varying external magnetic field is applied to head element 30. After a predetermined QC test interval, the probes are relocated to the read sensor terminals of another head element by physical movement of row 29, movement of probes 32–34, or some combination thereof, and the production QC measurement procedures are repeated. The entire row-level QC test plurality may be conducted on one head element at a time or each QC test may be in turn conducted over many or all of the head elements in row 29.

Figure 4:
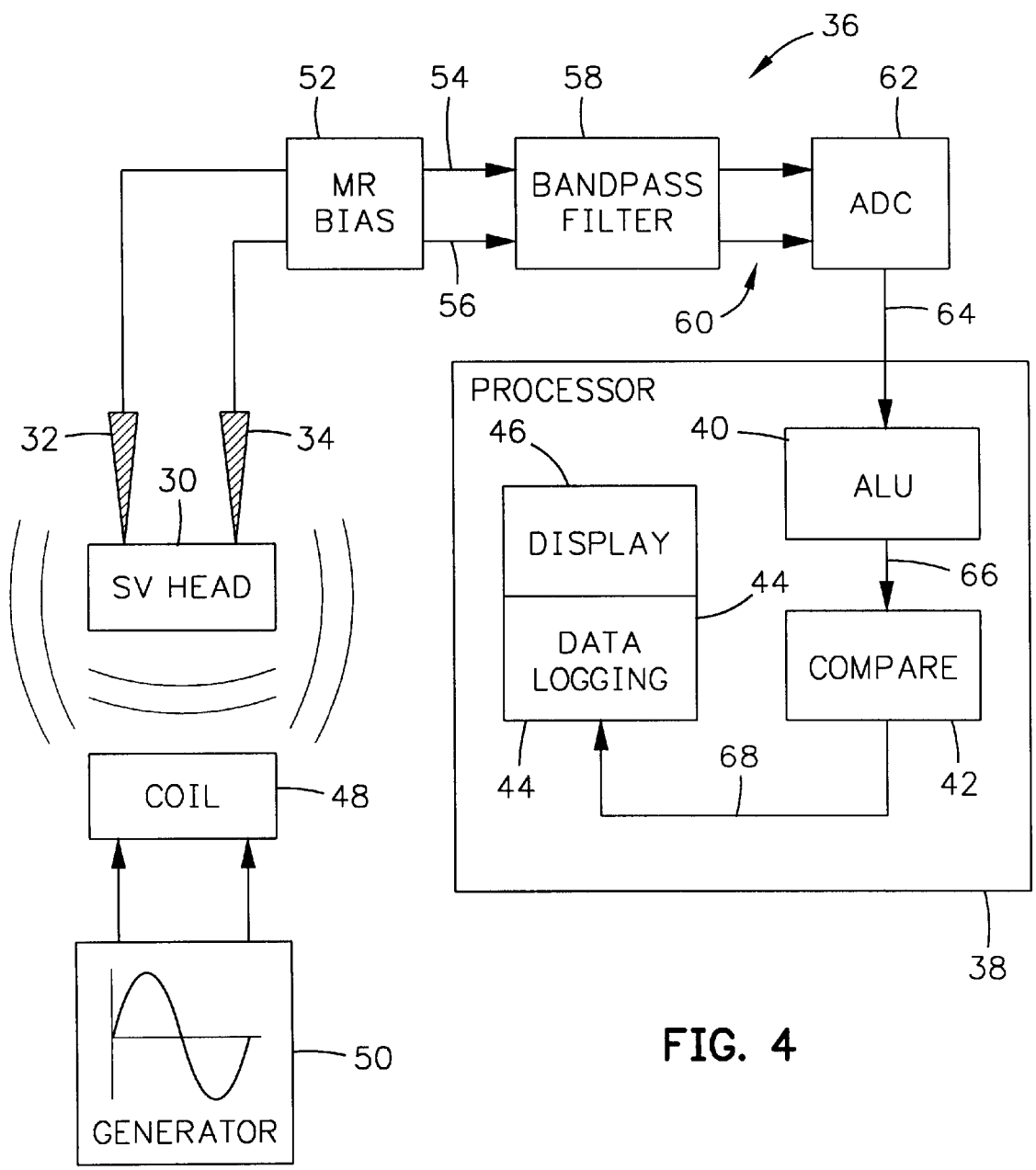
FIG. 4 is a functional block diagram illustrating the system of this invention.

FIG. 4 is a functional block diagram illustrating the TMEN screening system 36 of this invention for screening GMR heads for TMEN (Barkhausen noise) according to the method of this invention. TMEN screening system 36 includes a processor 38 with an arithmetic logic unit 40, a comparator 42, a test data logger 44 and a display 46. Referring to FIG. 4, head element 30 is immersed in a time varying magnetic field induced by a coil 48, which may be a Helmholtz coil or the like, powered by a waveform generator 50. While any time-varying waveform may be useful when transmitted from generator 50 to coil 48, for the purposes of this invention, a triangular waveform of, for example, 3 kHz, is preferred. The head biasing circuit 52 is coupled through probes 32 and 34 to head element 30 to provide the biasing current necessary for proper head operation and to sense changes in the voltage drop across head element 30. The head element signal in the lines 54 and 56 includes a signal representing the time-varying signal produced by generator 50 and an additional signal representing Barkhausen noise in head element 30. The bandpass filter 58 is selected to exclude the fundamental timevarying frequency and multiple harmonics on the low side and to exclude Barkhausen noise and other noise components above the operational data rate for head element 30. For example, when using a 3 kHz time-varying magnetic field, bandpass filter 58 may provide a pass band from 300 kHz to 3000 kHz to remove all fundamental complements through the $100^{th}$ harmonic and to exclude all noise signals above 3 MHz.

The analog signal 60 from bandpass filter 58 is passed to the analog-to-digital converter (ADC) 62, which converts analog signal 60 into a series of digital samples at the data line 64. It is an advantageous feature of the method of this invention that ADC 62 provides a high sampling rate relative to the lower passband frequency of bandpass filter 58; for example, a sampling rate of 5 MSamples per second. Each of the 5 million samples per second on data line 64 is transferred digitally to ALU 40 wherein it is sorted according to its relative value and counted to build a histogram representing the distribution of the millions of digital samples about a zero value centerline. In a noise-free head element, most of the samples will cluster around zero value. With increasing Barkhausen noise, increasing numbers of the samples fall further and further from the zero centerline of the histogram. This feature of the present invention may be appreciated with reference to the discussion of FIGS. 5–6 below. After completion of a predetermined sampling interval, the resulting histogram is analyzed in ALU 40 to produce the statistics 66, which are transmitted to comparator 42 for comparison with a predetermined set of histogram statistics. Depending on the results of the comparison performed and comparator 42, a pass/fail decision 68 is transmitted to data logger 44 to be logged in association with the particular head element 30 under test. The accumulated results logged by data logger 44 may be displayed on display 46. It is readily appreciated by those skilled in the art that the elements of processor 38 may be implemented as software elements in a general-purpose computer having a display, for example.

Figure 5:
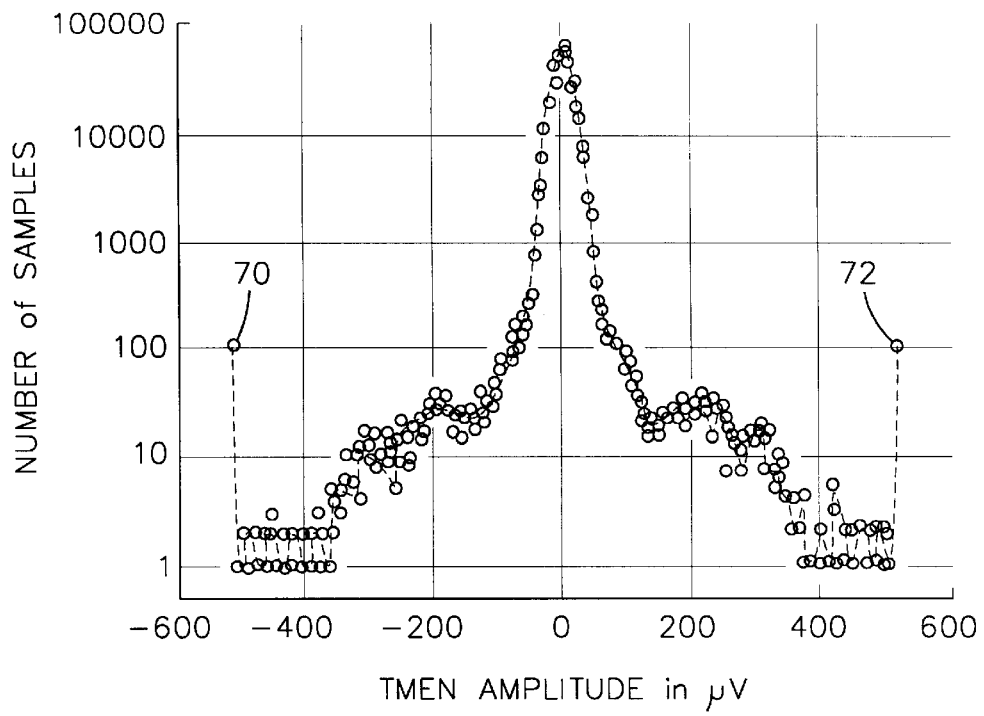
FIG. 5 illustrates the TMEN amplitude histogram of this invention for a GMR head having unacceptable levels of Barkhausen noise.

FIG. 5 illustrates the TMEN amplitude histogram of this invention for a GMR head having unacceptable levels of Barkhausen noise. The histogram is displayed on a semilogarithmic scale for ease of inspection. The statistics of the histogram (sample distribution) can be extracted to represent an intensity parameter of the magnetic noise produced in the head element under test. For example, the histogram in FIG. 5 can be examined to produce a TMEN range and weighted sum by extracting the range between sample counts above some value, for instance, 100 samples. In FIG. 5, this range is bounded by the points 70 and 72 and is valued at about 1000 microvolts. A TMEN weighted sum of the histogram may be easily calculated by summing the absolute values of the products of the two coordinates for each point in the histogram, for example. The inventors have found that the TMEN weighted sum and the TMEN range measures are preferred measures for screening GMR head elements according to the system of this invention. These measures are computed in ALU 40 (FIG. 4) and passed to comparator 42 for comparison with predetermined threshold values for the measures, as described below.

Figure 6:
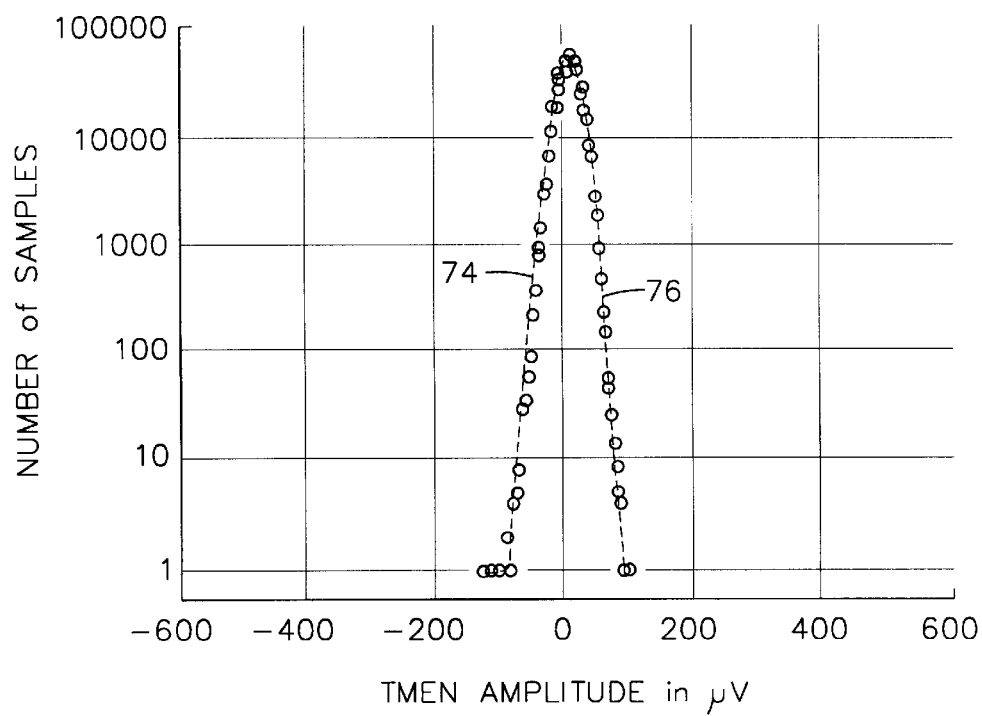
FIG. 6 illustrates the TMEN amplitude histogram of this invention for a GMR head having acceptable levels of Barkhausen noise.

FIG. 6 illustrates the TMEN amplitude histogram of this invention for a GMR head having acceptable levels of Barkhausen noise. The TMEN range measure for a 100 sample count limit is seen between the points 74 and 76 to be about 80 microvolts, which is only eight percent of the same measure found for FIG. 5. Similarly, casual inspection of FIG. 6 shows that the TMEN weighted sum (sum of the absolute values of all products for each point) is likely to be an order of magnitude smaller than that for the histogram in FIG. 5. Using both parameters is more useful than using one or the other because each parameter represents a different statistical measure of Barkhausen noise.

Figure 7:
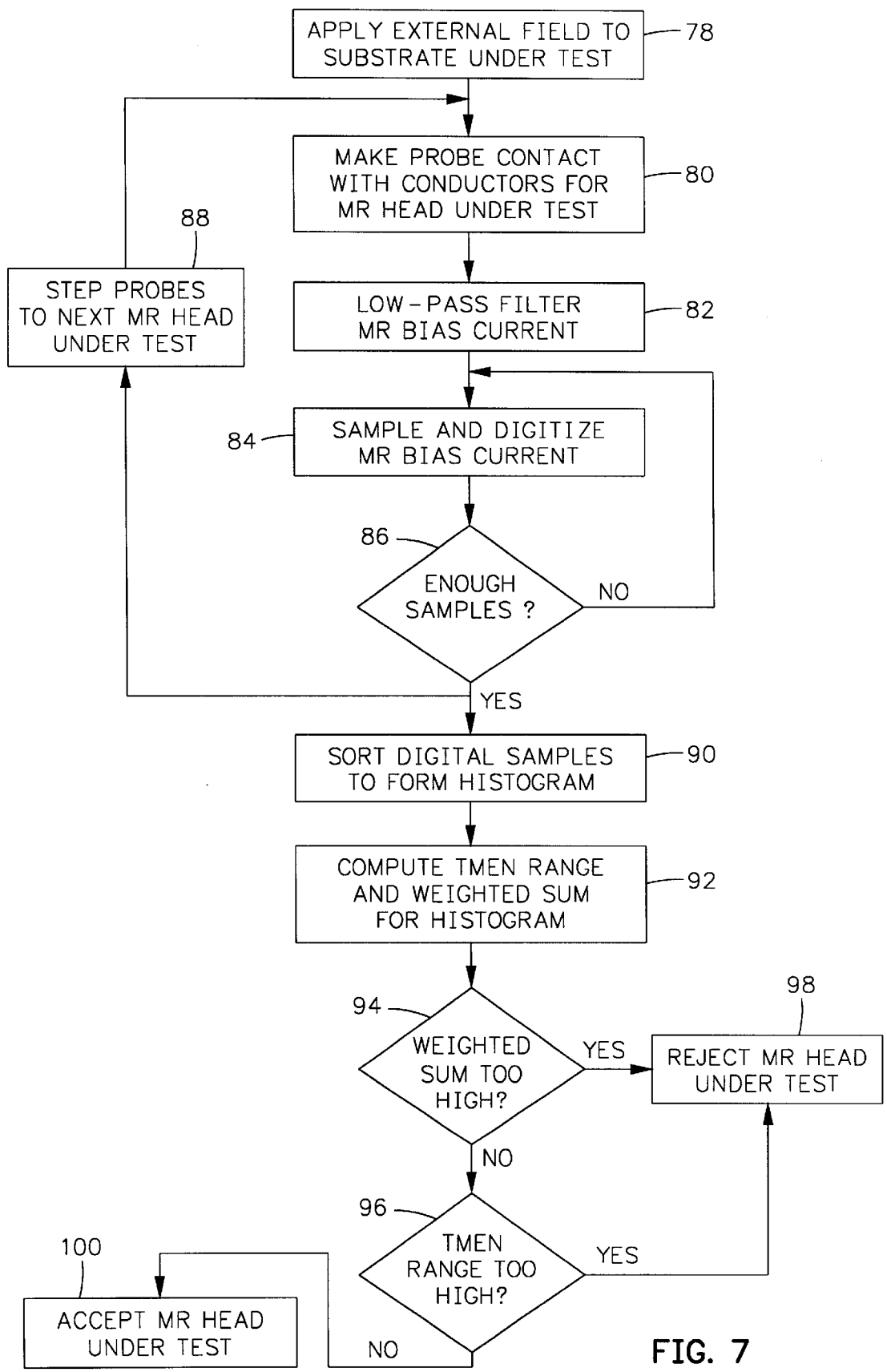
FIG. 7 is a block diagram illustrating an exemplary embodiment of the method of this invention.

FIG. 7 is a block diagram illustrating an exemplary embodiment of the method of this invention. In the first step 78, the substrate bearing the plurality of head elements under test is disposed in an external magnetic field. A first head element is positioned for contact with the test probes 32 and 34 (FIGS. 3–4) in the next step 80. In the following step 82, the MR bias current passed through the head element under test and, after low-pass filtering, the analog current amplitude is sampled and digitized at the step 84, which is repeated in a loop until sufficient samples are counted to satisfy the test condition at the step 86. After step 86 is satisfied, the step 88 moves the mechanical probes to the next head element in parallel with the step 90, which initiates the processing of the sample data by sorting them into bins and accumulating counts for each bin (step 90 may also proceed in parallel with steps 84–86, of course). After completion of steps 84 and 90 for a head element, the step 92 computes the TMEN range and weighted sum for use in the comparison steps 94 and 96, which may proceed in series or parallel. If either measure fails the comparison tests in steps 94 and 96, the head element is declared rejected in the step 98; otherwise, the head element is declared accepted in the step 100.

Clearly, other embodiments and modifications of this invention may occur readily to those of ordinary skill in the art in view of these teachings. Therefore, this invention is to be limited only by the following claims, which include all such embodiments and modifications when viewed in conjunction with the above specification and accompanying drawing.

We claim:

1. A method for measuring an intensity parameter of the magnetic noise of a giant magnetoresistive (GMR) head having a signal bias current, the method comprising the steps of:

applying to the GMR head a time-varying transverse magnetic field having a fundamental frequency;

filtering the signal bias current to remove all frequency components below a lower band-pass frequency that is substantially higher than the fundamental transverse magnetic field frequency to produce a filtered signal bias current;

sampling the filtered signal bias current at a sampling rate substantially higher than the lower band-pass frequency to produce a plurality of digital signals representing a plurality of filtered signal bias current values;

sorting the plurality of digital signals by value to form a histogram having a transverse magnetic-field excited noise (TMEN) range and weighted sum; and comparing at least one of the histogram TMEN range and weighted sum to a respective predetermined threshold value to determine the intensity parameter of the GMR head magnetic noise.

2. The method of claim 1 wherein the lower bandpass frequency is at least fifty times the fundamental transverse magnetic field frequency.

3. The method of claim 2 wherein the sampling rate is at least five-hundred times the fundamental transverse magnetic field frequency.

4. The method of claim 3 wherein the filtered signal bias current value plurality exceeds 50,000.

5. The method of claim 1 wherein the sampling rate is at least five-hundred times the fundamental transverse magnetic field frequency.

6. The method of claim 1 wherein the filtered signal bias current value plurality exceeds 50,000.

7. A method for screening a plurality of giant magnetoresistive (GMR) heads for unacceptable magnetic noise levels, the method comprising the steps of:

passing a signal bias current through a first GMR head;

applying to the first GMR head a time-varying transverse magnetic field having a fundamental frequency;

filtering the signal bias current to remove all frequency components below a lower band-pass frequency that is substantially higher than the fundamental transverse magnetic field frequency to produce a filtered signal bias current;

sampling the filtered signal bias current at a sampling rate substantially higher than the lower band-pass frequency to produce a plurality of digital signals representing a plurality of filtered signal bias current values;

sorting the plurality of digital signals by value to form a histogram having a transverse magnetic-field excited noise (TMEN) range and weighted sum;

comparing the histogram TMEN range and weighted sum each to a respective predetermined threshold value; and rejecting the first GMR head when at least one of the histogram TMEN range and weighted sum exceeds the respective predetermined threshold value.

8. The method of claim 7 wherein the lower bandpass frequency is at least fifty times the fundamental transverse magnetic field frequency.

9. The method of claim 8 wherein the sampling rate is at least five-hundred times the fundamental transverse magnetic field frequency.

10. The method of claim 9 wherein the filtered signal bias current value plurality exceeds 50,000.

11. The method of claim 7 wherein the sampling rate is at least five-hundred times the fundamental transverse magnetic field frequency.

12. The method of claim 7 wherein the filtered signal bias current value plurality exceeds 50,000.

13. A system for screening a plurality of giant magnetoresistive (GMR) heads for unacceptable magnetic noise levels, the system comprising:

a probe assembly for passing a signal bias current through a first GMR head;

a coil assembly for applying to the first GMR head a time-varying transverse magnetic field having a fundamental frequency;

a band-pass filter for removing from the signal bias current all frequency components below a lower band-pass frequency that is substantially higher than the fundamental transverse magnetic field frequency to produce a filtered signal bias current;

an analog-to-digital converter assembly for sampling the filtered signal bias current at a sampling rate substantially higher than the lower band-pass frequency to produce a plurality of digital signals representing a plurality of filtered signal bias current values;

an arithmetic logic assembly for sorting the plurality of digital signals by value to form a histogram having a transverse magnetic-field excited noise (TMEN) range and weighted sum;

a comparator for comparing the histogram TMEN range and weighted sum each to a respective predetermined threshold value; and a test data logging assembly for recording the rejection of the first GMR head when at least one of the histogram TMEN range and weighted sum exceeds the respective predetermined threshold value.

14. The system of claim 13 wherein the lower bandpass frequency is at least fifty times the fundamental transverse magnetic field frequency.

15. The system of claim 14 wherein the sampling rate is at least five-hundred times the fundamental transverse magnetic field frequency.

16. The system of claim 15 wherein the filtered signal bias current value plurality exceeds 50,000.

17. The system of claim 13 wherein the sampling rate is at least five-hundred times the fundamental transverse magnetic field frequency.

18. The system of claim 13 wherein the filtered signal bias current value plurality exceeds 50,000.

* * * * *